US009202538B2

(12) United States Patent
Gupta et al.

(10) Patent No.: US 9,202,538 B2
(45) Date of Patent: Dec. 1, 2015

(54) WORDLINE ACTIVATION

(71) Applicant: Infineon Technologies AG, Neubiberg (DE)

(72) Inventors: Siddharth Gupta, Munich (DE); Gunther Lehmann, Holzkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/097,425

(22) Filed: Dec. 5, 2013

(65) Prior Publication Data

US 2015/0162056 A1 Jun. 11, 2015

(51) Int. Cl.
*G11C 11/419* (2006.01)
*G11C 7/12* (2006.01)
*G11C 5/14* (2006.01)
*G11C 11/4074* (2006.01)
*G11C 16/08* (2006.01)
*G11C 8/08* (2006.01)
*G11C 11/4094* (2006.01)
*G11C 7/04* (2006.01)
*G11C 11/418* (2006.01)
*G11C 13/00* (2006.01)
*G11C 11/408* (2006.01)
*G11C 16/30* (2006.01)

(52) U.S. Cl.
CPC .. *G11C 7/12* (2013.01); *G11C 7/04* (2013.01); *G11C 8/08* (2013.01); *G11C 11/418* (2013.01); *G11C 13/0028* (2013.01); *G11C 16/08* (2013.01); *G11C 5/14* (2013.01); *G11C 11/4082* (2013.01); *G11C 11/4094* (2013.01); *G11C 11/419* (2013.01); *G11C 16/30* (2013.01)

(58) Field of Classification Search
CPC .......... G11C 11/419; G11C 7/12; G11C 5/14; G11C 8/08; G11C 11/4094; G11C 11/4085; G11C 16/30
USPC .............................. 365/154, 155, 156, 189.08
See application file for complete search history.

(56) References Cited

U.S. PATENT DOCUMENTS

| | | | |
|---|---|---|---|
| 6,504,777 B1* | 1/2003 | Hsu et al. ...................... | 365/205 |
| 7,486,540 B2 | 2/2009 | Gouin et al. | |
| 8,248,851 B1* | 8/2012 | Pio ........................... | 365/185.11 |
| 8,315,123 B2* | 11/2012 | Chong et al. ............. | 365/230.06 |
| 9,013,939 B2* | 4/2015 | Yamagami .................... | 365/203 |
| 2005/0122811 A1* | 6/2005 | Song et al. .................... | 365/203 |
| 2007/0025169 A1* | 2/2007 | Houston ....................... | 365/206 |
| 2007/0030741 A1* | 2/2007 | Nii et al. .................. | 365/189.11 |
| 2009/0034337 A1* | 2/2009 | Aritome ................... | 365/185.18 |
| 2009/0086554 A1 | 4/2009 | Chanussot et al. | |
| 2009/0296497 A1* | 12/2009 | Hirabayashi ............. | 365/189.09 |
| 2012/0075946 A1* | 3/2012 | Evans et al. .................. | 365/203 |
| 2012/0236673 A1* | 9/2012 | Kajigaya ...................... | 365/226 |
| 2012/0300550 A1* | 11/2012 | Hemink et al. .......... | 365/185.17 |

OTHER PUBLICATIONS

Koichi Takeda, et al.; "Multi-Step Word-Line Control Technology in Hierarchical Cell Architecture for Scaled-Down High-Density SRAMs"; IEEE Journal of Solid-State Circuits, vol. 46, No. 4, Apr. 2011, p. 806-814.

Vibhu Sharma; "SRAM Design for Wireless Sensor Networks: Energy Efficient and Variability Resilient Techniques"; Chapter 3: "Adaptive Voltage Optimization Techniques: Low Voltage SRAM Operation"; Springer, 2013, p. 31-43.

Michael Clinton, et al.; "Session 18 Overview: Advanced Embedded SRAM"; Memory Subcommittee; ISSCC 2013; IEEE International Solid-State Circuits Conference; Feb. 20, 2013, p. 314-325.

* cited by examiner

*Primary Examiner* — Ly D Pham
(74) *Attorney, Agent, or Firm* — Eschweiler & Associates, LLC

(57) ABSTRACT

Methods and devices are disclosed where a voltage on a wordline is changed from a first voltage to a second voltage via a plurality of intermediate voltages.

19 Claims, 6 Drawing Sheets

WORDLINE ACTIVATION

FIELD

The present application relates to activation of wordlines of memory arrangements.

BACKGROUND

Memory arrangements usually comprise a plurality of memory cells. In some cases, each memory cell stores one bit. Various types of memory arrangements and corresponding memory cells may be used, for example SRAM (static random access memory), dual port SRAM, multi-port SRAM, DRAM (dynamic random access memory), flash memory, resistive RAM, STT-MRAM (spin transfer torque magnetoresistive random access memory), PC-RAM (phase change random access memory), CB-RAM (conductive bridging RAM) or ROM (read only memory). Memory arrangements like other kinds of circuits have undergone an increasing miniaturization in recent years. However, with decreasing feature sizes a variation of threshold voltages is increasing due to increasing variations when manufacturing the circuits. This may lead to a reduced stability (often characterized by a static noise margin SNM) and/or a reduced writability (often characterized by a write margin WM) of memory cells like SRAM cells and may limit the usage of such cell at low voltages. Furthermore, high temperatures which are required by some applications like automotive applications may have a further negative impact on stability and/or writability. On the other hand, operation at low voltages and high temperatures is desirable for some applications.

DETAILED DESCRIPTION

Figure 1:
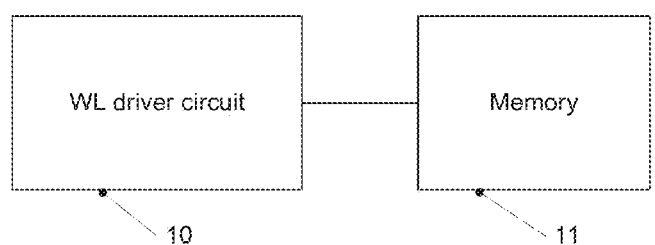
FIG. 1 is a schematic block diagram of a device according to an embodiment.

In the following detailed description, various embodiments will be described with reference to the attached drawings. It should be noted that the embodiments described herein or shown in the drawings serve only illustrative purposes and are not to be construed as limiting. For example, while embodiments may be described comprising a plurality of elements, this is not to be construed as indicating that all these elements are necessary for implementation. Instead, other embodiments may comprise alternative elements, or fewer elements than the embodiments described or illustrated. Also, additional elements may be provided. Furthermore, elements from various embodiments may be combined with each other unless noted otherwise.

It should be noted that elements depicted in the drawings are not necessarily depicted to scale with each other but are depicted in a manner to provide a clear understanding of the respective embodiment. Furthermore, connections or couplings between various elements may be realized by direct connections or couplings, i.e. connections or couplings without intervening elements, or also indirect connections or couplings, i.e. connections or couplings with one or more intervening elements, as long as the general function of the connection or coupling, for example to transmit a certain kind of information or a certain kind of signal, or to select a certain memory cell is not altered.

Embodiments relate to an activation of a wordline for writing to or reading from a memory circuit. In embodiments, the voltage is ramped between a first voltage and a second voltage in a stepwise manner, for example via a plurality of intermediate voltages. In an embodiment, the intermediate voltages are held for respective certain times before proceeding to the next intermediate voltage. The times may be predetermined or may be determined based on properties of the memory arrangement like process variations or also outside properties like temperature. Other embodiments may use other techniques.

Generally, many types of memory arrangements use wordlines and bitlines for accessing the memory arrangement, for example for writing to the memory arrangement or for reading from the memory arrangement. In particular, via a combination of wordlines and bitlines a specific memory cell of the memory arrangement may be addressed.

For example, for a write operation a bitline or bitlines connected to a memory cell may be set to a value to be written, and then a wordline connected to the memory cell may be activated. Conversely, for reading to a memory cell, a wordline may be activated and the value may be read from the bitline(s). In some types of memory cells like SRAM cells bitlines not being used for a write access may be pre-charged to a predetermined value, for example an intermediate value between a value representing a logic zero and a value representing a logic one.

Turning now to the figures, in FIG. 1 a memory device according to an embodiment is shown. In the embodiment of FIG. 1, the memory device of FIG. 1 comprises a wordline driver circuit 10 and a memory arrangement 11. Further elements not depicted in FIG. 1 for clarity reasons may be used, for example components used in conventional memory devices.

Memory arrangement 11 may comprise a plurality of memory cells being accessible via a plurality of wordlines and a plurality of bitlines. Wordline driver circuit 10 is coupled to the wordlines of memory circuit 11 and controls a voltage on the wordlines. Memory arrangement 11 may for example comprise an SRAM memory arrangement, a dual port SRAM memory arrangement, a multi-port SRAM memory arrangement, a DRAM memory arrangement, a flash memory arrangement, a resistive RAM arrangement, an STT-MRAM arrangement, a PC-RAM arrangement, a CB-RAM arrangement or a ROM arrangement, but is not limited thereto.

As will be explained in the following in more detail using examples, wordline driver circuit 10 is configured to ramp a voltage on a wordline to be activated from a first value to a second value in a plurality of steps, at least one intermediate voltage between the first voltage and the second voltage being held for a specific time. In some embodiments, the second voltage may correspond to a supply voltage level like VDD or VSS or a voltage level of 0 V. Generally, in cases a wordline activation for a particular memory arrangement is done by increasing the voltage, the second voltage may be higher than the first voltage. However, in other cases a logic may be implemented such that for activation a voltage on the wordline is decreased (for example from VDD to 0 V or to VSS), in which case the second voltage may be smaller than the first voltage.

Such a stepwise wordline activation may increase robustness of the memory device for example against process variations or high temperatures in some embodiments.

Figure 2:
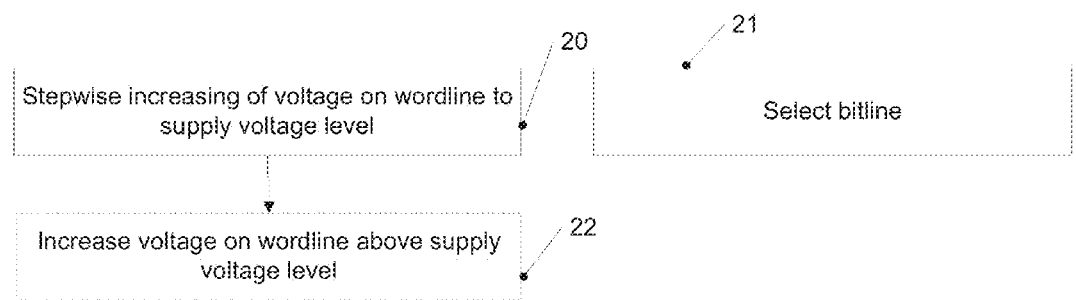
FIG. 2 is a flowchart illustrating a method according to an embodiment.

In FIG. 2 a flowchart illustrating a method according to an embodiment is shown. The method of FIG. 2 may for example be implemented in the memory device of FIG. 1, or in combination with any of the devices or techniques described later. However, the method may also be implemented in other memory devices.

At 20, a voltage on a wordline to be activated is e.g. increased to a supply voltage level like VDD in a stepwise manner. For example, the increasing may be performed via one or more intermediate voltage levels, for example more than one intermediate voltage level, e.g. three or more intermediate voltage levels, wherein each intermediate voltage level is held for a certain time before further increasing the voltage. Examples for such a stepwise increase will be given later.

Furthermore, at 21 a bitline is selected. For example, in case of a write process the bitline may be set to a value to be written to the memory prior to the stepwise increasing at 20. Conversely, for a read operation the selected bitline may be read out after the stepwise increasing at 20. In addition, in some embodiments a (i.e. one or more) bitline may be precharged to a voltage level ahead of a bitline selection (e.g. a selection of a bitline for a write or read operation) and/or ahead of a write or a read operation. Furthermore, in some embodiments a (i.e. one or more) bitline might be left floating, i.e. not being connected to any voltage supply ahead of a bitline selection and/or ahead of a write or read operation.

Optionally, after the voltage has been increased to a supply voltage level, the voltage of the wordline may be increased above the supply voltage level, to apply an overdrive voltage. In some embodiments, such an application of an overdrive voltage may facilitate writing to the memory arrangement. By the stepwise increasing of the voltage at 20, the stability of the memory cells involved is not degraded, in particular of memory cells along the activated wordline which are not being written to, as those memory cells in some embodiments are able to partially discharge a bitline connected to them during the stepwise increasing of voltage at 20, resulting in a reduced voltage difference between an internal node of those memory cells and the bitline.

The method of FIG. 2 applies to a case where the voltage is increased for wordline activation. In other embodiments, a similar method may be applied to embodiments where the voltage on the wordline has to be decreased. Here, instead of stepwise increasing the voltage, the voltage may be stepwise decreased to a nominal voltage level, for example to a low supply voltage level like VSS or to any other fixed level like 0 V, depending on the implementation. Correspondingly, optionally at 22 the voltage may then be decreased below this nominal voltage level.

Figure 3:
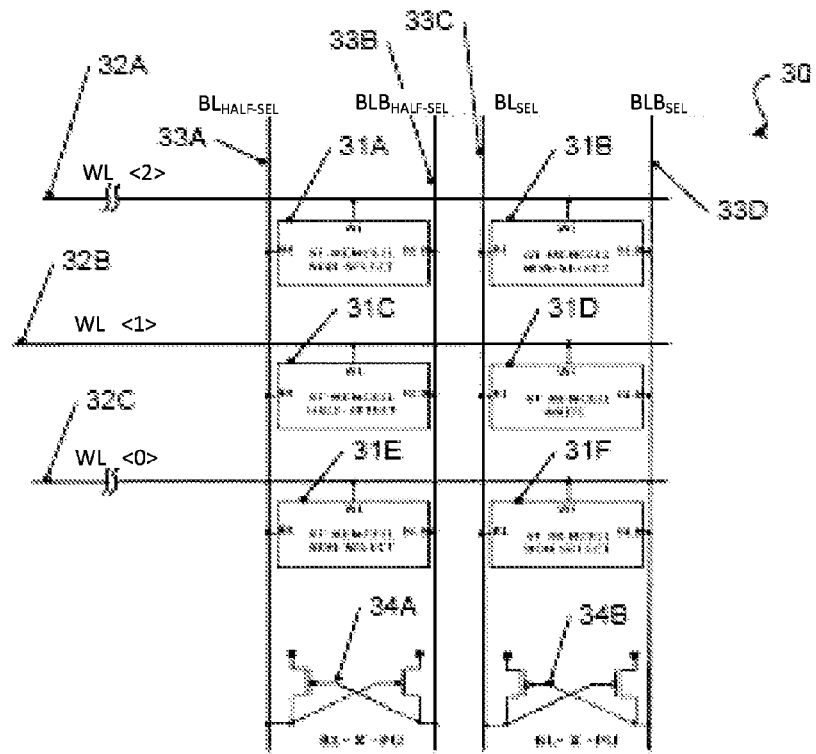
FIG. 3 shows an example for a memory arrangement usable in embodiments.

Next, some specific examples for stepwise increasing of a voltage on a wordline will be given. While the examples apply to increasing the voltage level, they may be applied to decreasing the voltage level correspondingly. An example memory arrangement used for these explanations is shown in FIG. 3. FIG. 3 shows an SRAM memory arrangement comprising six memory cells 31A-31F which are arranged in three rows and two columns. While an SRAM memory arrangement is used as an example, this is not to be construed as limiting and merely serves illustration purposes. As explained with reference to FIG. 1, other types of memory arrangements may be used as well. Furthermore, the number of six memory cells 31 is chosen merely for the ease of representation to provide an illustrative example, and other numbers of memory cells may be used as well depending on a memory capacity desired. For example, memory arrangements may comprise several thousands of memory cells or several millions of memory cells.

Memory cells 31A and 31B are coupled to a first wordline 32A, memory cells 31C and 31D are coupled to a second wordline 32B and memory cells 31E and 31F are coupled to a third wordline 32C, which may also be referred to as WL<2>, WL<1> and WL<0>, respectively.

Memory cells 31 may for example be implemented as 6T memory cells (six transistor memory cells). However, other conventional types of SRAM cells like 4T memory cells or any other types of memory cells may be used as well.

Memory cells 31A, 31C and 31E are coupled with bitlines 33A, 33B. In this respect, references to memory cells coupled with "a bitline" also includes memory cells coupled to two bitlines as in the case of FIG. 3. Bitlines 33A, 33B are coupled via cross-coupled transistors 34A as shown in FIG. 3. In some embodiments, a source side of cross-coupled transistors 34A may be connected to power supply, like VDD or logic 1 as shown FIG. 3. This has the effect that when bitline 33A is discharged to a value between logic 1 and logic 0, bitline 33B will be forced to a logic 1 via cross-coupled transistors 34A and vice versa. In some embodiments, this may correspond to maintaining a charge of a first bitline (like bitline 33A) of a bitline pair coupled to a selected memory cell of the memory arrangement by negative feedback of a voltage on a second bitline (like bitline 33B) of the bitline pair. In a similar manner, memory cells 31B, 31D and 31F are coupled with bitlines 33C and 33D, bitlines 33C and 33D being coupled via cross-coupled transistors 34B. Bitlines 33A, 33C are also referred to as "BL"-bitlines, and Bitlines 33B, 33D are referred to as "BLB"-bitlines.

Therefore, each of the six memory cells 31 of FIG. 3 may be identified by an associated wordline and an associated pair of bitlines which are coupled via cross-coupled transistors.

In the situation of FIG. 3, it is assumed that data (e.g. a bit) is to be written to memory cell 31D. To perform such a write, generally bitline 33C is set to the value to be written and bitline 33D to the correspondingly inverted value. For example, to store a logic one bitline 33C may be set to a high potential representing logic one and bitline 33D may be set to a low potential corresponding to logic zero. In this case, bitlines 33C and 33D may be referred to as "selected". Conversely, bitlines 33A and 33B are set to a so-called "half-selected" state where they are for example set to a same potential between the high potential and the low potential. Subsequently, wordline 32B coupled to memory cell 31D is activated, for example changed from a low potential like 0 or VSS to a higher potential corresponding for example to a supply voltage like VDD. By activating wordline 32B an internal memory node of memory cell 31D is connected to bitlines 33C, 33D, whereby the desired data is written to memory cell 31D.

At the same time by activation of wordline 32B memory cell 31C is coupled with bitlines 33A, 33B. However, as bitlines 33A, 33B are in a half-selected state, no change of a value stored in memory cell 31C should occur.

However, with conventional activation of the wordline 32B, for example by just switching the voltage from 0 V to VDD, the activation of the wordline might couple into the internal node of memory cell 31C, which may "tip the balance" such that the content of memory cell 31C may accidentally be changed. A similar situation may occur when reading from a memory cell. In addition, with the conventional activation of the wordline 32B, in some cases a bitline connected to a memory cell 31C being connected to this wordline 32B may not be discharged fast enough. This could lead to a voltage difference between the bitline and an internal node of this memory cell, in some cases being close to a voltage difference of VDD. Such a voltage difference may "tip the balance" such that the content of memory cell 31C may accidentally be changed.

The above-described operation of the memory arrangement 30 of FIG. 3 with an abrupt wordline activation essentially corresponds to a conventional SRAM operation and will not be described in further detail. As already mentioned, techniques described herein regarding a stepwise activation of wordlines may also be applied to other conventional memory arrangements.

In some embodiments, by stepwise activation of the wordlines as mentioned above with respect to FIGS. 1 and 2 and as further described using examples in more detail below, a risk of unintentionally changing a content of a memory cell not being accessed may in some cases be reduced or eliminated.

Figure 4:
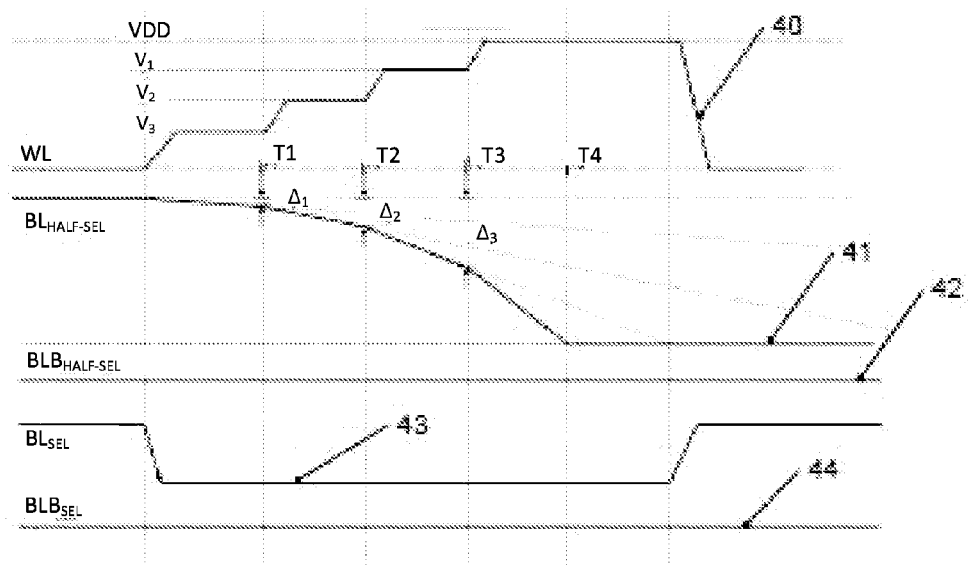
FIG. 4 is a diagram illustrating voltages within a memory arrangement according to an embodiment.

In FIG. 4, an example for a wordline activation for the example memory arrangement of FIG. 3 where memory cell 31D is selected to be accessed, e.g. written to, is shown. The example of FIG. 3 shows a write process. Similar activation of wordlines may be used for reading operations.

In FIG. 4, a curve 40 represents a stepwise wordline activation, for example of wordline 32B of FIG. 3. Such a stepwise activation may for example be controlled by a wordline driver circuit like wordline driver circuit 10 of FIG. 1. A further embodiment of a suitable circuit will be explained later with reference to FIG. 8. A curve 41 shows a voltage over time at a bitline like bitline 33A, and a curve 42 shows a voltage over time at a bitline like bitline 33B. A curve 43 shows a voltage over time at a bitline like bitline 33C, and a curve 44 shows a voltage over time for a bitline like bitline 33D. In other words, curves 43 and 44 belong to bitlines of a selected memory cell, while curves 41 and 42 apply to a bitline of a non-selected memory cell. In the example shown, for activation of the wordline the voltage of the wordline is raised for example from 0 V or approximately 0 V (or any other starting voltage in a deactivated state like VSS or VDD) to a supply voltage VDD via three intermediate voltages V1, V2 and V3. While three intermediate voltages are shown in FIG. 4, the number of intermediate voltages is not particularly limited. In other words, more or less steps than the four steps shown may be used. For example, between 1 and 8 intermediate voltages, or between 2 and 8 intermediate voltages may be used. The differences between the intermediate voltages in some embodiments may be the same, such that each of the steps has the same "height". In other embodiments, different step sizes (heights) may be used for different steps. After reaching each intermediate voltage V1-V3, the intermediate voltage is held for a certain time. Each intermediate voltage may be held for the same time, or different times. The times may be predetermined times or may be determined by a device like wordline driver circuit 10 of FIG. 1 depending on circumstances like process variations, supply voltage level and/or temperature and/or any other parameters of the memory arrangement, e.g. a length of a wordline of the memory arrangement. For example, for higher temperatures longer times may be used. In some embodiments, the times for which the intermediate voltages are held may be of the order of 100 picoseconds, but depending on technology used and applications also other values are possible.

It should be noted that in embodiments during a read operation the BUBLB selected and half selected BL/BLB have the same waveform as indicated by curve 41/42 and consequently the data can be read out of any of the bitline pairs BUBLB for example using a sense amplifier. Here, the BL or BLB is allowed to be discharged by the respective selected memory cell only and the other bitline BLB or BL, respectively may be held high using e.g. cross-coupled transistors 34A and 34B of FIG. 3.

As can be seen from curve 41, compared to an immediate wordline activation to VDD without intermediate steps, the memory cell is able to discharge the bitline represented by curve 41 (for example bitline 33A of FIG. 3), i.e. a bitline associated with a non-selected memory cell, to some extent during the voltage ramp, as indicated by $\Delta_1$, $\Delta_2$ and $\Delta_3$ in FIG. 4. Thereby, a voltage difference between an internal storage node of the memory cell like memory cell 31C and the bitline like bitline 33A is reduced before the wordline reaches its full level, VDD in the example of FIG. 4. In some embodiments, this may reduce the couplings described above for conventional approaches and thus may improve a stability of a memory cell corresponding to a reduced chance of inadvertently changing data stored in the memory cell like memory cell 31C.

In some embodiments, a slope of the wordline activation may be controlled independently for each of the plurality of voltage steps. For example, a slower slope may be selected during a beginning of wordline activation. For example, to obtain a slower slope a time during which the voltage is held may be increased, or the time the voltage takes to reach for example the first intermediate voltage V1 may be increased compared to later rise times. This in some embodiments allows half-selected memory cells (like memory cell 31C of FIG. 3) to discharge the relevant connected bitline a bit thereby improving a stability of the half-selected memory cell of the voltage step.

In some embodiments, the voltage steps are controlled by switching elements employing a voltage divider or other control circuits the operation of which does not rely on RC time constants, i.e. combinations of resistive elements and capacitive elements.

By using separate voltage steps, in some embodiments a low dependency on manufacturing variations or temperature changes may be achieved. A specific example for a corresponding implementation will be explained below. In some embodiments, the stepwise wordline activation enables the use of smaller memory cells than otherwise necessary, which may bring about an area saving. For example, under some circumstances instead of a 0.300 μm² memory cell in a 40 nm technology a 0.250 μm² memory cell may be used, corresponding to an area saving of about 20%.

Also, in some embodiments, by applying a stepwise wordline activation conventional memory cells may be used beyond their qualified use conditions, for example at a higher temperature than specified (for example 160° C. instead of 120° C.) or at lower voltages (for example 0.7 V instead of 0.8 V) without having to develop a new dedicated memory cell which would meet these extended conditions or without using additional dedicated peripheral memory circuits, sometimes referred to as assist circuits, which assist circuits leading to additional area consumption and other disadvantages like increased power consumption. Other embodiments may provide other advantages or effects. In other words, the above effects may apply only to some embodiments, whereas other embodiments may show none of the above effects.

Figure 5:
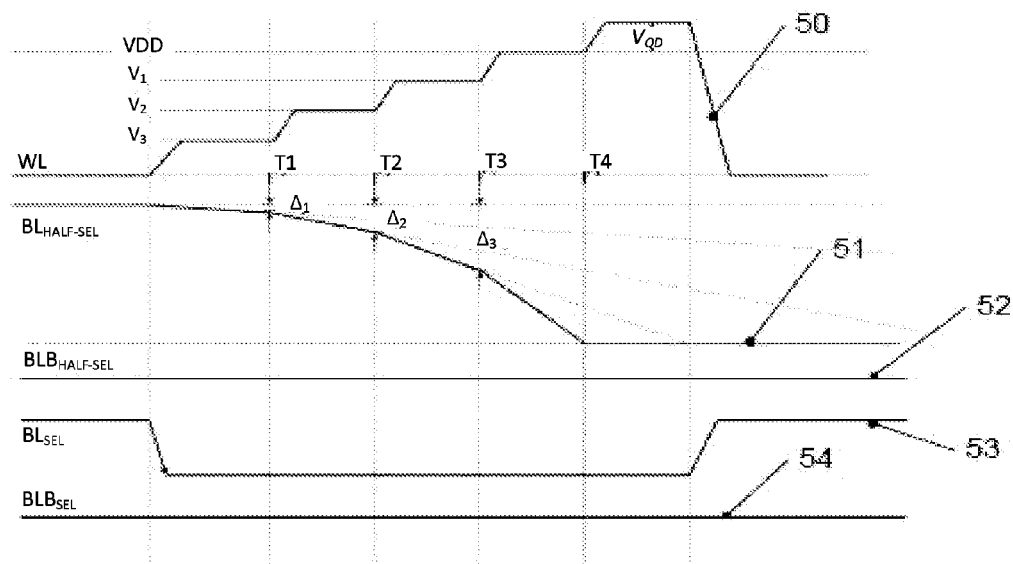
FIG. 5 is a diagram showing voltages within a memory arrangement according to a further embodiment.

FIG. 5 shows a wordline activation according to a further embodiment. Again, the memory arrangement of FIG. 3 is taken as an example. A curve 50 shows a voltage on a wordline, curves 51 and 52 show voltages on half-selected bitlines like bitlines 33A, 33B of FIG. 3, and curves 53 and 54 show voltages on selected bitlines like bitlines 33C and 33D of FIG. 3. Curves 51-54 essentially correspond to curves 41-44 of FIG. 4, respectively, and will not be described again in detail. Curve 50 shows a rising of the voltage on the wordline, for example wordline 32B of FIG. 3, to a voltage VDD via three intermediate voltages $V_1$-$V_3$, similar to curve 40 of FIG. 4. After VDD has been reached, in the embodiment of FIG. 5 additionally an overdrive voltage $V_{OD}$ is applied where the wordline voltage is increased beyond the nominal voltage VDD. In the example of FIG. 5, therefore the voltage after the voltage steps, i.e. VDD, is between the overdrive voltage $V_{OD}$ and a voltage of the wordline at the beginning of the ramp, for example 0 V. In such an embodiment, the memory cell may be written more easily in some cases, improving writability of the memory cell (like memory cell 31D of FIG. 3). By applying the plurality of voltage steps while rising the voltage to VDD prior to applying the overdrive voltage above VDD, in embodiments, adverse effects of the overdrive voltage on the stability of the memory cells, for example memory cells not being written to like memory cell 31C of FIG. 3 are reduced or prevented.

It should be noted that variations and modifications regarding the voltages steps discussed with reference to FIG. 4 above also apply to the embodiment of FIG. 5.

Figure 6:
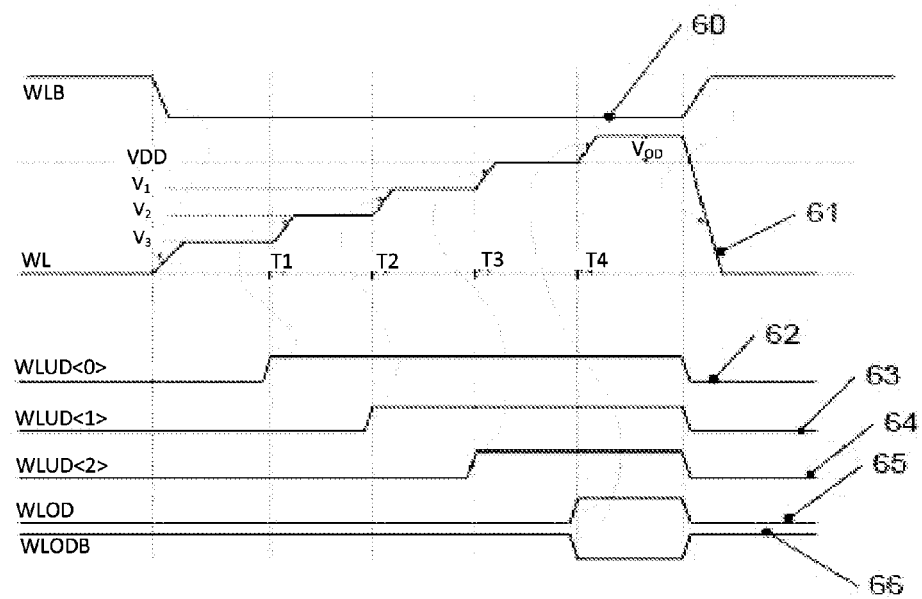
FIG. 6 is a diagram showing voltages within a memory arrangement according to a further embodiment.

FIG. 6 shows an example for control signals according to an embodiment which may be used to apply the wordline activation of FIG. 5. A corresponding implementation for applying the wordline voltage based on such control signals will be explained later with reference to FIG. 8.

Curve 61 of FIG. 6 corresponds to curve 50 of FIG. 5 and shows a wordline activation via three intermediate voltages followed by the application of an overdrive voltage $V_{OD}$.

A curve 60 shows a signal WLB which enables the activation of the wordline. Signals WLUD<0>, WLUD<1> and WLUD<2> represented in curves 62-64 activate the individual voltage steps, for example by switching a switchable voltage divider. Signals WLOD and WLODB represented in curves 65 and 66 activate the overdrive voltage $V_{OD}$. However, it should be noted that the signals shown in FIG. 6 serve merely as an example, and in other embodiments other signaling may be used to provide a stepwise activation of wordlines.

Figure 7:
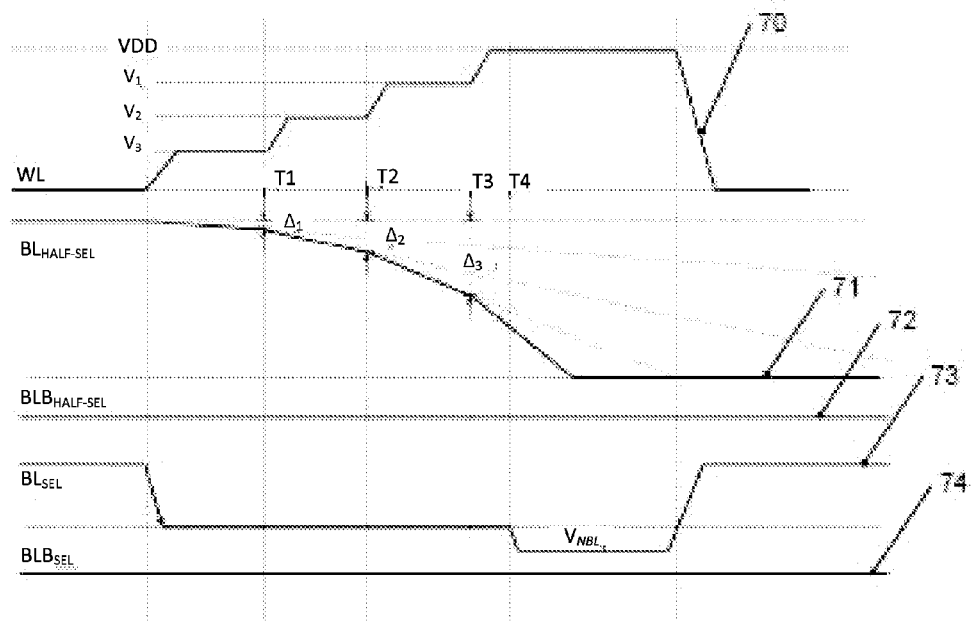
FIG. 7 is a diagram showing voltages within a memory arrangement according to an embodiment.

A further embodiment of wordline activation is shown in FIG. 7. In the embodiment of FIG. 7 the wordline activation is shown in a curve 70 which in this case corresponds to curve 40 of FIG. 4. In other embodiments, also in the case of FIG. 7 an overdrive voltage may be applied.

Curves 71 and 72 correspond to curves 41 and 42 of FIG. 4 and show voltages on bitlines of a half-selected memory cell, i.e. a memory cell not being written or read from, including a discharging of a bitline as represented by curve 71 and as explained previously. Curves 73 and 74 show voltages on selected bitlines like bitlines 33C and 33D of FIG. 3, respectively. In contrast to FIG. 4, in the embodiment of FIG. 7 at the end of the wordline activation, i.e. when the wordline voltage has reached VDD, a negative voltage step $V_{NBL}$ is applied to the selected bitline. This in some embodiments has a similar effect as applying an overdrive voltage to the wordline. In other words, in some embodiments, write operation of the memory cell may be improved as with the negative voltage $V_{NBL}$ on the selected bitline the voltage of the internal storage node of the memory cell may be overwritten more easily. Still, by applying the voltage steps a degradation of the stability of other memory cells like memory cell 31C of FIG. 3 is reduced or prevented.

Also with respect to FIG. 7, modifications regarding the wordline activation discussed with reference to FIG. 4 are also applicable. For example, more voltage steps may be used, a voltage difference between the voltage steps may be selected differently, or hold times for the various voltage steps may differ.

Next, with reference to FIG. 8, an implementation of a wordline voltage control circuit according to an embodiment will be discussed in more detail. Other implementations are also possible. The example implementation may use the control signals shown as an example in FIG. 6, which in the embodiment of FIG. 8 may be generated by a controller 88, but is not limited thereto.

Figure 8:
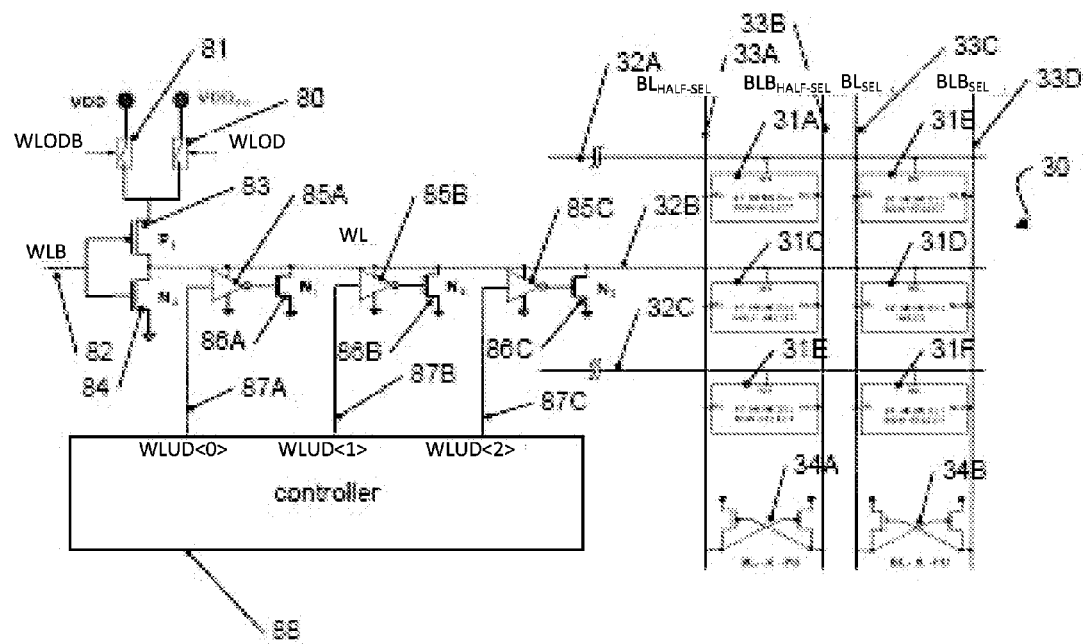
FIG. 8 illustrates a memory arrangement including a wordline driver circuit according to an embodiment.

As an example memory arrangement, memory arrangement 30 of FIG. 3 is used for illustration purposes in FIG. 8. However, the wordline activation circuit of FIG. 8 may also be used for other types of memory arrangements. The wordline activation circuit of FIG. 8 is shown as being coupled to wordline 32B. Similar circuits may be coupled to the other wordlines, or one circuit may be used for a plurality of wordlines and selectively coupled to a desired wordline via multiplexing circuitry, switches or the like.

Wordline activation is enabled by a signal WLB applied at 82. As long as wordline activation is disabled, which in the example of FIG. 8 means that signal WLB is set high, an NFET transistor 84 couples wordline 32B to a reference potential like ground or 0 V or VSS, symbolized by a triangle in FIG. 8. At the same time, a PFET transistor 83 is non-conducting between its source and drain terminals. To enable wordline activation, WLB is set low as shown in FIG. 6 as an example, making NFET transistor 84 non-conducting and PFET transistor 83 conducting between the respective source and drain terminals. Therefore, depending on signals WLODB and WLOD which operate on switches 81, 80, respectively, wordline 32B is coupled to VDD (when WLODB is high and WLOD is low, for example) or to an overdrive voltage $VDD_{OD}$ (when WLODB is low and WLOD is high). For example, during normal wordline activation, until VDD is reached, switch 81 is closed and switch 80 is open. Then, to apply an overdrive voltage, switch 80 is closed and switch 81 may be opened. In embodiments like the embodiments of FIG. 4 where no overdrive voltage is applied, PFET transistor 83 may be directly coupled to VDD, and switches 80, 81 and the connection to $VDD_{OD}$ may be omitted.

Coupled to wordline 32B is a second part voltage divider circuit of which PFET transistor 83 is a first part. This second part in the embodiment of FIG. 8 comprises a first inverter 85A controlling an NFET transistor 86A, a second inverter 85B controlling an NFET transistor 86B and a third inverter 85C controlling an NFET transistor 86C. NFET transistors 86A, 86B and 86C are activated via their respective inverter 85A, 85B and 85C via control signals WLUD<0>, WLUD<1> and WLUD<2> to generate desired voltage steps when activating the wordline. Signals WLUD<0>-WLUD<2> are supplied as inputs 87A-87C of inverters 85A-85C, respectively.

The voltage applied to wordline 32B in the embodiment of FIG. 8 is determined by the ratio of a resistance constituted by PFET transistor 83 to a resistance constituted by the parallel coupling of NFET transistors 86A, 86B and 86C. The size of the voltage steps and the voltage levels (for example, V1, V2 and V3 of FIG. 6) may be selected by sizing and designing transistor 83 and transistors 86A-86C accordingly. Furthermore, in embodiments, where more or less voltage steps are desired, more or less combinations of inverters 85 and NFET transistors 86 may be provided. Furthermore, the implementation of FIG. 8 is merely an example, and other implementations are also possible. For example, voltage dividers may be implemented differently than shown in FIG. 8, for example by using other elements than PFET transistors and NFET transistors. In embodiments, PFET transistors may be implemented as PMOS transistors, and/or NFET transistors may be implemented as NMOS transistors. However, other transistor types may also be used. Moreover, in cases where for wordline activation the voltage is ramped down from a first value to a second lower value, the logic of FIG. 8 may be reversed, for example by exchanging the conductivity types of the transistors, e.g. PFET transistors and NFET transistors, and voltages correspondingly.

An embodiment implemented as shown in FIG. 8 may serve to take process variations into account. In particular, the wordline activation circuit of FIG. 8 may be implemented together with a memory arrangement like memory arrangement 30 using the same processes, such that process variations affecting memory arrangement 30 also affect the wordline activation circuit. If for example due to process variations an underlying manufacturing technology shifts towards weak NFET and strong PFET transistors, a stability of memory cells 31, e.g. SRAM cells may be increased in embodiments. Through the same process variations, the voltages applied to the wordline which are as explained above determined by effective resistances of PFET transistor 83 and NFET transistors 86 would be shifted to higher voltages. In the opposite case of strong NFETs and weak PFETs the memory cell may be less stable. At the same time, lower wordline voltages which may help to maintain stability would be provided by the circuit of FIG. 8. Therefore, the implementation of FIG. 8 may offer a "tracking" of process variations and a corresponding modification of wordline voltages corresponding to changes of a stability of memory cells in some embodiments.

In other embodiments, voltage levels may be controlled as a function of the manufacturing process in other manners. Generally, slower slopes of stepwise voltage ramps may be provided in embodiments when a manufacturing process in on a "slow" processing edge, for example based on implant variations, gate oxide variations (thicker gate oxides) or variations of lengths of polysilicon elements. Moreover, the timing and selection of voltage levels may also be performed as a function of the VDD voltage, for example by using slower slopes (for example longer hold times) when the VDD voltage is lower. Furthermore, the timing and selection may also be controlled based on temperature, for example by activating slower slopes (i.e. an effective slower rising of the voltage, for example by providing more voltage steps or by providing longer hold times at the different voltage steps) when the temperature is higher.

Figure 9:
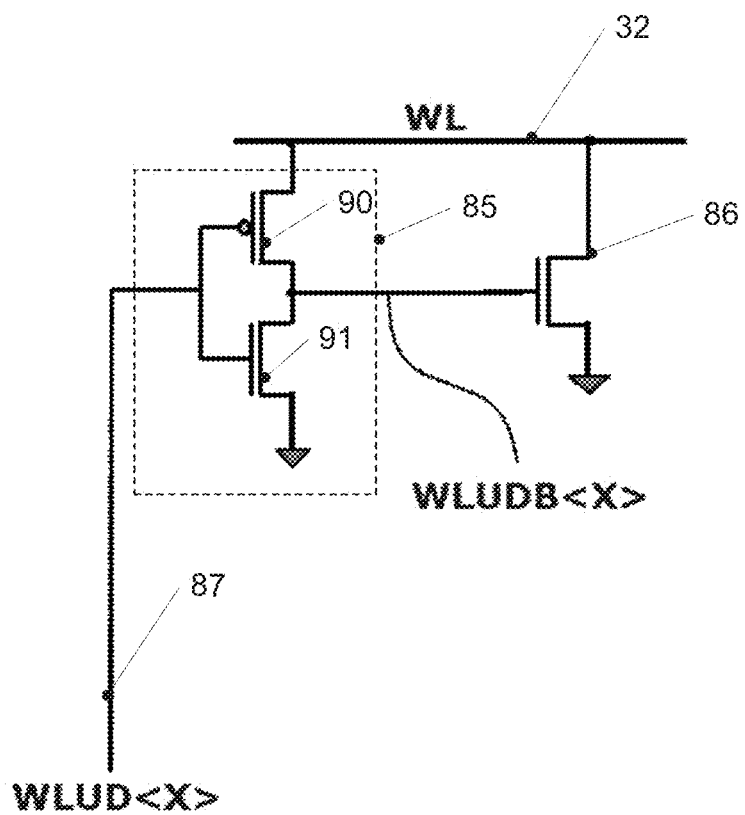
FIG. 9 shows a possible implementation of a detail of the circuit of FIG. 8.

In FIG. 9, an example implementation of inverters 85 (85A, 85B, 85C) of FIG. 8 is shown. In the example of FIG. 9, inverters 85 may be realized by a combination of an PFET transistor 90 and an NFET transistor 91. In the example of FIG. 9 a power supply of the inverters 85 is connected to the wordline WL thereby effectively activating NFET transistors 86 only if the word line WL itself is activated. However, other implementations of inverters are equally possible.

In some embodiments described above it is assumed that bitlines are left floating for a read operation, i.e. there is no connection of the bitlines to a power supply except a connection via the memory cell. Similarly, in case of a write operation, it is assumed that all bitlines are left floating except the ones being written to. In some other embodiments, bitline precharge devices may be used for precharging bitlines of a memory arrangement to desired levels. In some embodiments, such bitline precharge devices may be disabled prior to starting a voltage ramp on a wordline. In other embodiments, two sets of bitline precharging devices may be used, namely "weak" precharge devices which use for example smaller transistors for implementation and "strong" bitline precharge devices using for example larger transistors for implementation. In embodiments, the weak precharge devices may be used before or during a write or read operation, whereas strong precharge devices may be used at an end of an operation like a write operation or a read operation.

In some embodiments, the weak precharge devices may be controlled individually for each bitline or pair of bitlines, while the strong precharge devices may be jointly controlled for all bitlines or a group of bitlines in some embodiments.

Figure 10:
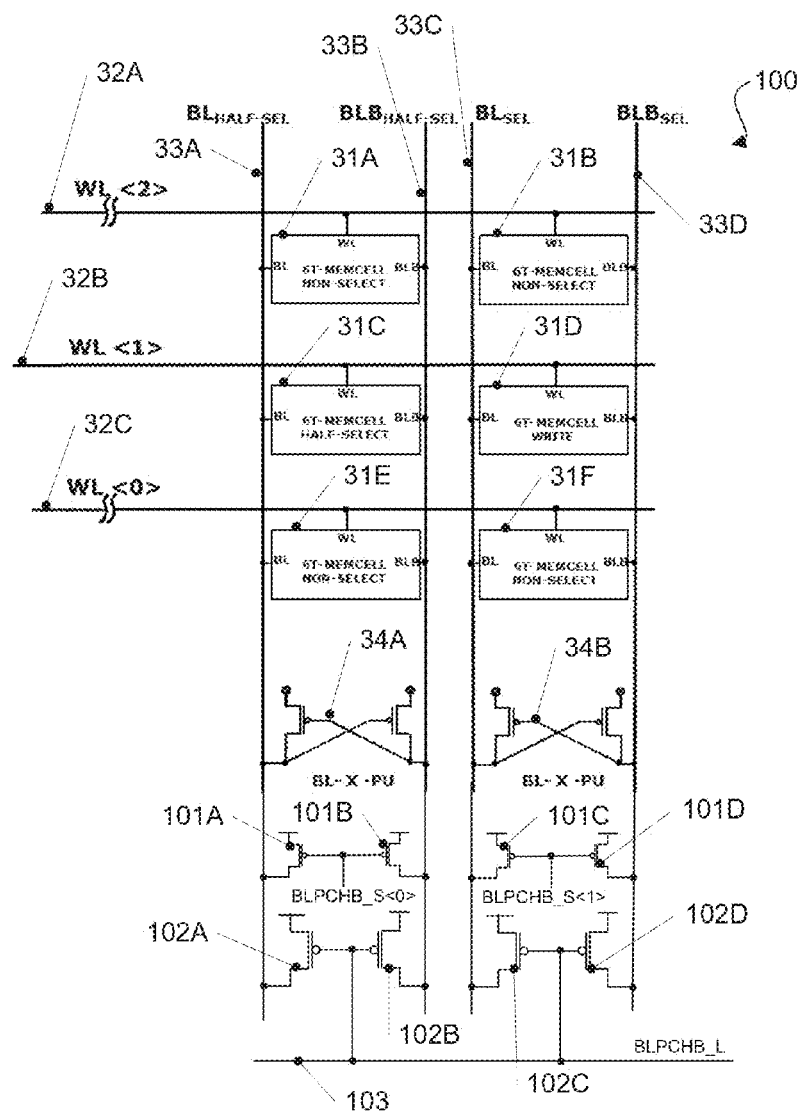
FIG. 10 shows a possible implementation of a memory arrangement according to a further embodiment.

An illustrative example of a corresponding memory arrangement 100 is shown in FIG. 10. The memory arrangement 100 of FIG. 10 is based on memory arrangement 30 of FIG. 3, and corresponding elements bear the same reference numerals as in FIG. 3 and will not be discussed again. Modifications and variations discussed with reference to FIG. 3 also apply to memory arrangement 100 of FIG. 10. Bitlines 33A and 33B are coupled to a "weak" bitline precharge device comprising PFET transistors 101A, 101B as shown in FIG. 10. Gate terminals of PFET transistors 101A, 101B are controlled by a signal BLPCHB_S<0>. Likewise, bitlines 33C and 33D are coupled to a weak bitline precharge device comprising PFET transistors 101C and 101D, gate terminals of which are controlled via a signal BLPCHB_S<1>.

Furthermore, bitlines 33A, 33B are coupled with a strong bitline precharge device comprising PFET transistors 102A, 102B, and bitlines 33C and 33D are coupled with a strong bitline precharge device comprising PFET transistors 102C and 102D. In an embodiment, PFET transistors 101 (101A-101D) are smaller and therefore "weaker" than PFET transistors 102 (102A-102D). The terms smaller and larger in this respect refer to one or more dimensions of the PFET transistors, in particular dimensions of a channel like a width of a transistor channel.

Gate terminals of PFET transistors 102 are controlled by a signal BLPCHB_L via an interconnecting connection 103. With the weak and strong precharge devices, the bitlines may for example be precharged to a precharge voltage level like VDD via the circuits shown a same voltage is applied to each bitline of a pair of bitlines (bitlines 33A and 33B or bitlines 33C and 33D).

It should be noted that in other embodiments the precharge devices shown may be omitted, or only a single precharge device may be provided for each pair of bitlines to precharge the bitlines to a precharge voltage level like VDD.

Figure 11:
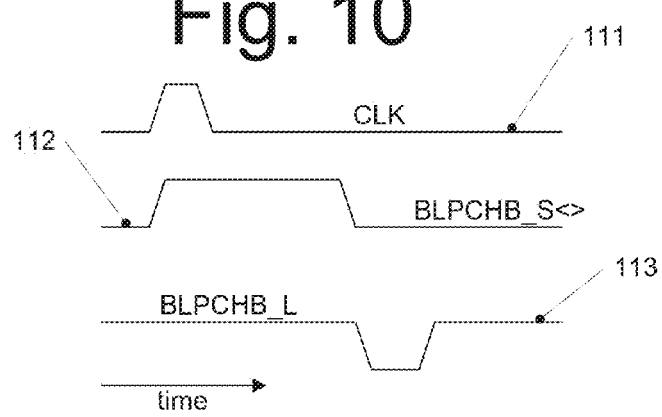
FIG. 11 shows an example for control signals applied to the memory arrangement of FIG. 10.

In FIG. 11, an example for control signals for strong and weak bitline precharge devices as shown in FIG. 10 is shown. A clock signal 111 for example marks a beginning of a write access or a read access. With the beginning of the write access marked by the clock signal, as shown by a curve 112 a weak bitline precharge device assigned to a memory cell to be accessed (for example the device formed by transistors 101C, 101D for the discussed write access to cell 31D) is deactivated. At an end of the access, as shown by curve 113 all strong bitline precharge devices are activated. Therefore, all bitlines are brought back to a precharge voltage level like VDD where both bitlines assigned to each cell have the same potential.

In other embodiments, other implementations of precharge devices may be used.

In view of the plurality of modifications and variations for various embodiments described above, it is to be emphasized that the embodiments discussed serve only as illustrative examples and are not to be construed as limiting the scope of the present application. For example, embodiments described above or shown in the drawings may be implemented in a corresponding inverse logic to the logic shown or described, where e.g. PFETs are replaced by NFETs and vice versa, VDD is replaced by VSS and vice versa, rising waveforms are replaced by falling waveforms and vice versa, and high voltage levels are replaced by low voltage levels and vice versa, etc.

What is claimed is:

1. A method, comprising:
providing a memory arrangement comprising a plurality of wordlines;
changing a voltage of a selected wordline of the plurality of wordlines from a first voltage at which the wordline is deactivated to a second voltage at which the wordline is activated via a plurality of different intermediate voltages, each intermediate voltage being held for a respective certain time,
wherein a first difference in voltage between the first voltage and a first intermediate voltage, a second difference in voltage between adjacent intermediate voltages, and a third difference in voltage between a last intermediate voltage and the second voltage, are equal; and
accessing a memory cell coupled to the selected wordline only after the voltage has reached the second value.

2. The method of claim 1, wherein the certain time for each intermediate voltage is predetermined.

3. The method of claim 1, wherein the certain time for each intermediate voltage is determined depending on at least one of supply voltage, a process variation or temperature.

4. The method of claim 1, wherein the first voltage is a first supply voltage, and the second voltage is a second, different supply voltage.

5. The method of claim 1, further comprising changing the voltage on the wordline from the second voltage to a third voltage, the second voltage being between the first voltage and the third voltage, after the second voltage has been reached.

6. The method of claim 1, further comprising changing a voltage on a bitline after the wordline has reached the second voltage.

7. The method of claim 1, further comprising deactivating a first bitline precharging of at least one bitline coupled to a selected memory cell of the memory arrangement prior to the changing.

8. The method of claim 7 further comprising activating a second bitline precharging of the at least one bitline coupled to the selected memory, the second bitline precharging using smaller transistors than the first bitline precharging.

9. A device, comprising:
a memory arrangement, and
a wordline activation circuit configured to change a voltage on a selected wordline of the memory arrangement from a first voltage at which the wordline is deactivated to a second, different voltage at which the wordline is activated via a plurality of different intermediate voltages, each of the plurality of different intermediate voltages being held for a respective certain time,
wherein the device is configured to access a memory cell coupled to the selected wordline only after the voltage has reached the second value, and
wherein a first difference in voltage between the first voltage and a first intermediate voltage, a second difference in voltage between adjacent intermediate voltages, and a third difference in voltage between a last intermediate voltage and the second voltage, are equal.

10. The device of claim 9, wherein a number of the intermediate voltages is between 2 and 8.

11. The device of claim 9, wherein the certain time for each of the intermediate voltages is predetermined.

12. The device of claim 9, wherein the wordline activation circuit comprises a voltage divider.

13. The device of claim 9, further comprising
a weak bitline precharge device and a strong bitline precharge device each associated with bitlines of the memory arrangement, the weak bitline precharge device comprising smaller transistors than the strong bitline precharge device.

14. A device, comprising:
a transistor of a first conductivity type to be coupled between a first supply voltage and a wordline,
a plurality of transistors of a second, different conductivity type selectively coupled between the wordline and a second, different supply voltage, the plurality of transistors of the second conductivity type being selectively individually and independently activatable to adjust a wordline voltage to a plurality of different intermediate voltage values on the wordline.

15. The device of claim 14, further comprising a plurality of inverters, an input of each of the inverters being configured to receive a respective activation signal, an output of each of the inverters being coupled with one of the transistors of the second conductivity type, and a power supply of each of the inverters being coupled to the wordline.

16. The device of claim 14, wherein the transistor of the first conductivity type is selectively coupled to the first supply voltage or a third voltage, the first supply voltage having a value between the third voltage and the second supply voltage.

17. The device of claim 14, further comprising a further transistor of the second conductivity type coupled between the wordline and the second supply voltage, an activation input being coupled to the transistor of the first conductivity type and the further transistor of the second conductivity type.

18. A method, comprising:
providing a memory arrangement comprising a plurality of wordlines;
changing a voltage of a selected wordline of the plurality of wordlines from a first voltage at which the wordline is deactivated to a second voltage at which the wordline is activated via a plurality of different intermediate voltages, each intermediate voltage being held for a respective certain time;
accessing a memory cell coupled to the selected wordline only after the voltage has reached the second value; and
maintaining a charge of a first bitline of a bitline pair coupled to a selected memory cell of the memory arrangement by negative feedback of a voltage on a second bitline of said bitline pair.

19. A device, comprising:

a memory arrangement; and a wordline activation circuit configured to change a voltage on a selected wordline of the memory arrangement from a first voltage at which the wordline is deactivated to a second, different voltage at which the wordline is activated via a plurality of different intermediate voltages, each of the plurality of different intermediate voltages being held for a respective certain time, wherein the device is configured to access a memory cell coupled to the selected wordline only after the voltage has reached the second value, and wherein the wordline activation circuit is further configured to apply an overdrive voltage having a value greater than the second voltage to the selected wordline after the second voltage has been reached.

\* \* \* \* \*